United States Patent [19]

Crewe

[11] Patent Number: 5,336,891
[45] Date of Patent: Aug. 9, 1994

[54] ABERRATION FREE LENS SYSTEM FOR ELECTRON MICROSCOPE

[75] Inventor: Albert V. Crewe, Palos Park, Ill.

[73] Assignee: ARCH Development Corporation, Chicago, Ill.

[21] Appl. No.: 899,433

[22] Filed: Jun. 16, 1992

[51] Int. Cl.$^5$ .............................................. H01J 37/10
[52] U.S. Cl. ........................ 250/396 R; 250/396 ML
[58] Field of Search ............... 250/396 R, 396 M, 398

[56] References Cited

U.S. PATENT DOCUMENTS

| | | |
|---|---|---|
| 3,852,597 | 12/1974 | Yanaka et al. . |
| 4,095,104 | 6/1978 | LePoole et al. . |
| 4,219,732 | 8/1989 | Nakagawa et al. . |
| 4,362,945 | 12/1982 | Riecke .......................... 250/396 ML |
| 4,414,474 | 11/1983 | Crewe . |
| 4,429,222 | 1/1984 | Yonezawa . |
| 4,475,044 | 10/1984 | Kuroda et al. ............... 250/396 ML |
| 4,618,766 | 10/1986 | van der Mast et al. . |
| 4,629,898 | 12/1986 | Orloff et al. . |
| 4,851,670 | 7/1989 | Krivanek . |
| 4,962,313 | 10/1990 | Rose . |
| 4,963,748 | 10/1990 | Szilagyi . |
| 5,023,457 | 6/1991 | Yonezawa . |
| 5,043,570 | 8/1991 | Takabayashi . |
| 5,065,027 | 11/1991 | Takashima et al. ......... 250/396 ML |

*Primary Examiner*—Bruce C. Anderson
*Attorney, Agent, or Firm*—Reinhart, Boerner, Van Deuren, Norris & Rieselbach

[57] ABSTRACT

A system for reducing aberration effects in a charged particle beam. The system includes a source of charged particles, such as electrons or ions, and various building blocks for operating on the charged particle beam to generate a desired particle beam pattern. These building blocks can include at least one of a uniform magnetic field component and a uniform electrostatic field component arrangeable in different combinations, enabling coefficients of spherical and chromatic aberration to be canceled out thereby providing a charged particle beam having greatly diminished aberration.

8 Claims, 3 Drawing Sheets

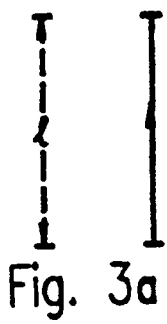 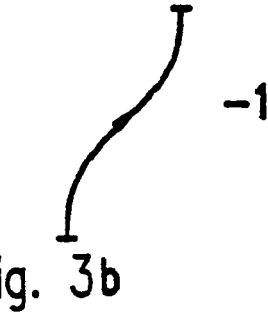 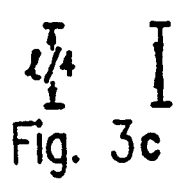
Fig. 3a     Fig. 3b     Fig. 3c
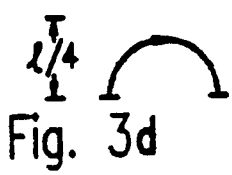 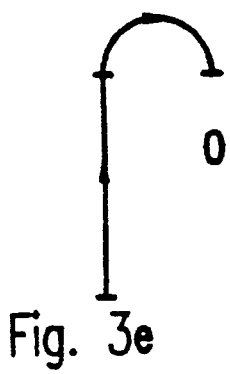 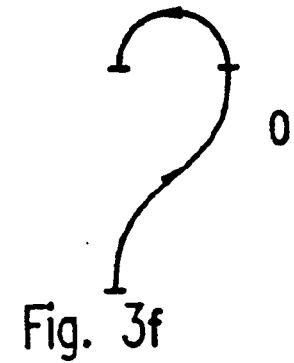
Fig. 3d     Fig. 3e     Fig. 3f
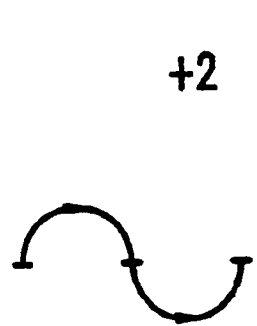 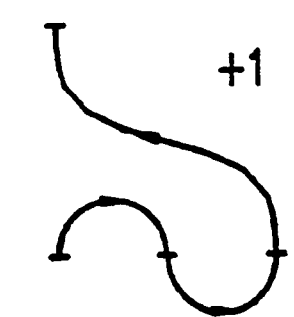 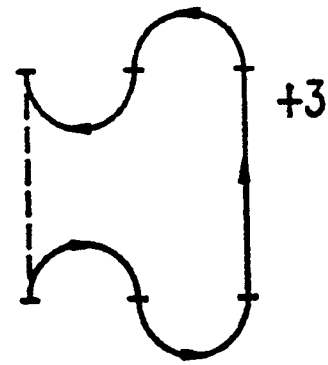
Fig. 3g     Fig. 3h     Fig. 3i

ABERRATION FREE LENS SYSTEM FOR ELECTRON MICROSCOPE

The present invention is generally concerned with a lens system for electron microscopes and charged particle imaging devices. More particularly, the invention is concerned with a lens system which eliminates spherical aberration in the lens system of an electron microscope.

Charged particles are widely used in a large variety of instruments and pieces of scientific equipment. These applications include mass spectrometers, cyclotrons, electron and ion microscopes, leak detectors and even the TV display tube. The general principles of operation of all these devices is well known. The particles can be guided using magnetic and electrostatic fields in various configurations, and generally speaking, the object is to take them from a source to an image and in doing so to change their characteristics. For example, in a mass spectrometer, a mixed source of various kinds of particles is brought to an image where particles of different mass are imaged at different points. In the electron microscope the image is a magnified one and is a faithful reproduction of the object.

In each of these devices or instruments the performance depends upon the size and nature of the image and this depends on the ability to produce an adequate focus. In some cases this may depend upon the precision of construction, but in other cases there may be fundamental reasons why the size of the image cannot be reduced further. In the present invention we are concerned with the latter.

The quality of the image is usually characterized by the "order" of the focussing. If the image depends on the first power of the angle of convergence of the particles as they move towards the final image, it is called a first order focus. If this is the only dependence, the image will be a perfect one. Unfortunately, this never happens in practice and there are always other higher order terms. If there is a dependence on the square of the angle of convergence, as in the case of devices which simply deflect the particles, the image will be increased in size in one direction or the other. There will then be a smearing effect which will limit the size of the focus and thereby limit the performance of the device. These effects are called second order aberrations. If we denote the angle in the x-direction by x and that in the y-direction by y, then there may be three second order terms, corresponding to $x^2$, $y^2$ and $xy$. Generally, this effect can be counteracted by reducing the maximum angle of convergence; but it will be appreciated that this will also limit the intensity of the particle beam, and in many cases this too will limit the performance.

In the special case of devices which operate with an axis of symmetry such as the electron microscope, there cannot be a dependence on the square of the angle of convergence precisely because of that symmetry. In that case, the terms which depend upon the cube of the angle become important, and these are called third order aberrations. This special case has received a great deal of attention because of its importance, and it was shown by Scherzer in 1936 that all lenses which have this symmetry have the same sign of third order (also called spherical) aberration and there are no lenses without such aberrations. It is the spherical aberration which limits the performance of all high voltage electron microscopes today. There are some well known exceptions to the Scherzer rules which apply in special cases. For example, when the device is large enough that material objects can be placed on the axis of symmetry and the particle distribution is large enough that they can go around such objects, the fields can be configured to avoid these aberrations. Such cases are quite limited, however, and this concept is not of value in most applications. Other instruments and devices which do not have this degree of symmetry can also have third order aberrations; and in that case there may be many terms, as can be appreciated from the discussion above, concerning second order aberrations.

The quality of the image is also affected by any variations in the energy of the particles. Since the effect of any applied fields, either magnetic or electrostatic, depends on the momentum or the velocity of the particles, any variation in those quantities will generally affect the image. Even when the applied voltages can be stabilized to extremely high precision, these effects can still be present because the sources of the particles are never completely monochromatic. Even the most precise of sources will have a spread in the energy of particles. In the best case this may be in the range of a few tenths of a volt, while in others it may be several volts. This effect is called chromatic aberration. The net result on the image generally depends on the ratio of the spread in the energies from the source to the final energy of the particles at the image. For this reason the effect is greatest for low energy devices, such as low voltage electron microscopes, and also for those cases when the energy distribution from the source is large, as is the case in ion microscopes.

Many methods have been proposed and implemented to control or eliminate one or more of these aberrations, but some have remained intractable or so difficult as to be impracticable. For example, deflection aberrations have been improved noticeably as can be seen any day on TV screens; but the spherical aberration in microscopes and chromatic aberration effects remain as great problems.

Very few suggestions have been put forward for the correction of spherical aberrations. A system of quadrupoles and octupoles was proposed by Scherzer in 1946 and attempts to make it work are still underway in Germany. Other attempts have been made but have not been successful. The conclusion has been reached that the practical realization of the idea leads to such a complicated device with so many intricate and very precise components that it cannot be made to work. If it could even be made to work, it would be too expensive to reproduce in any significant quantities. These devices as currently conceived appear to be directed towards the correction of chromatic aberration in low voltage microscopes rather than the correction of spherical aberration. In this configuration it is even more complicated since it is then necessary to use electrostatic elements, as well as magnetic ones. Since all elements involve a number of electrodes or pole pieces, the degree of complication is significantly increased.

A different method for correcting the spherical aberration of cylindrically symmetric lenses was proposed by Crewe in 1982. This involved the use of sextupole elements rather than quadrupoles and octupoles. This method is inherently simpler than the method of Scherzer, but even so it requires the use of at least three lenses and two sets of sextupoles. This method has been shown to be capable of correcting the aberrations in a demonstration system built in China, but it has not been shown to be effective at the scale necessary for use in a microscope or other precision equipment. In addition, the method has not been investigated for possible use as a corrector for chromatic aberration.

Finally, there is another method that has been proposed by Rempfer. This method uses electrostatic mirrors and a system of electrostatic lenses and deflectors to separate the incoming electron beam from the outgoing one. This method has not been demonstrated, and there is some doubt that it can correct the aberrations to the degree that is necessary. The system is very complicated, involving at least eleven different elements.

In summary, at least three methods have been proposed for the correction of spherical and/or chromatic aberration, but none have been demonstrated in practice. All prior methods suffer from the fact that they are extremely complicated and they are also very demanding in the precision with which the various elements must be assembled.

OBJECTS OF THE INVENTION

It is therefore an object of the invention to provide an improved electron microscope lens system.

It is another object of the invention to provide a novel lens system for a charged particle system having spherical aberration effects removed.

It is a further object of the invention to provide an improved method and system of manipulating a charged particle beam to avoid spherical aberration effects.

It is still another object of the invention to provide a novel lens system comprised of building blocks adapted for assembly in different combinations for achieving different objectives.

In a first form of the invention, the electrons (or other charged particles) move along or near to the axis of a uniform magnetic field. The electrons (we will use these as an example but the results apply equally to other charged particles) will be focussed at some distance 1 along the axis of the field and the image of a perfect point source will suffer from spherical and chromatic aberration. The coefficients of aberration are numerically equal to 1/2 and the spherical aberration ($C_s$) is negative while that for chromatic aberration ($C_c$) is positive.

In the second form of the invention the magnetic field is present as in the previous case, but a uniform electrostatic field is also applied in a direction perpendicular to the motion of the electron that is perpendicular to the magnetic field. In that case the electrons are deflected in a direction perpendicular to both fields. The important feature of this deflection is that no additional aberrations are introduced. The focussing takes place in the same plane as before, and the aberrations are exactly the same. This means that if the fields themselves are well stabilized, the deflection can take place over large distances without increasing the size of the focussed spot. This is significant because in the case of most deflection systems the spot size increases to the point that the image is too poor to use. For example, there has been a constant struggle in the area of electron beam lithography to increase the number of "resolution elements" that can be scanned in one sweep of the beam. That number is generally about 10,000 elements, and attempts to increase that number are thwarted by the increase in the size of the focussed spot. In our case the deflector would appear to be capable of scanning at least 100,000 elements. Finally, the amount of the deflection itself is primarily dependent on the mass of the particle, as would be expected since we are using both magnetic and electrostatic fields. This makes it possible to use the invention for mass spectrometers and the like.

In a third form of the invention an electrostatic field is parallel to the magnetic field and is arranged in such a way that the electrons are reflected back to the origin. If the strength of the field is properly chosen, the electrons will be refocussed in the plane of the origin; and in that case the aberrations have the important feature that they have exactly the same value as in the previous two cases but the signs are reversed. This feature has a direct application in the field of microscopy because it allows building a simple microscope which is free from aberrations.

In a fourth form of the invention, the two previous forms of the invention are combined. That is, there is a deflection field and a mirror field simultaneously. In this case the electrons are refocussed in the plane of origin; and the aberrations are reversed as before. However, there is also a net deflection of the beam. This makes it possible to separate the incoming beam from the outgoing one in a simple manner and increases the number of possible applications.

These four example systems have several features in common. First of all they all have unit magnification so that the angle of convergence at the image is equal to the angle of emission from the source. Next, they use uniform magnetic and electrostatic fields and can be adjusted to use the same magnetic field. This means they can be used as elementary building blocks and connected together into more complicated and mere useful systems. These units preferably have electrostatic fields which can be confined to the specific region where it is needed.

The invention further comprises combinations of certain features and elements described hereinafter and illustrated in the accompanying drawings and claims, it being understood that various changes in the details can be made without departing from the scope of the invention.

BRIEF DESCRIPTION OF THE DRAWINGS

FIG. 3A illustrates an arrangement for deflecting an electron beam with a uniform magnetic field; FIG. 3B shows a mirror lens system comprised of a tuned deflector; FIG. 3C illustrates a mirror with positive spherical aberration and negative chromatic aberration; FIG. 3D shows a mirror system with aberration the same as in the mirror; FIG. 3E is a combination of the mirror deflector and the lens arrangement; FIG. 3F is similar to FIG. 3E but a deflector is included; FIG. 3G is a system having aberration correction but the electron beam can move in the original direction of travel; FIG. 3H illustrates a system like FIG. 3G but a deflector is used to replace an electron beam on an original trajectory; and FIG. 3I shows a combination unit with three units of positive spherical aberration.

DETAILED DESCRIPTION OF PREFERRED EMBODIMENTS

Figure 1:
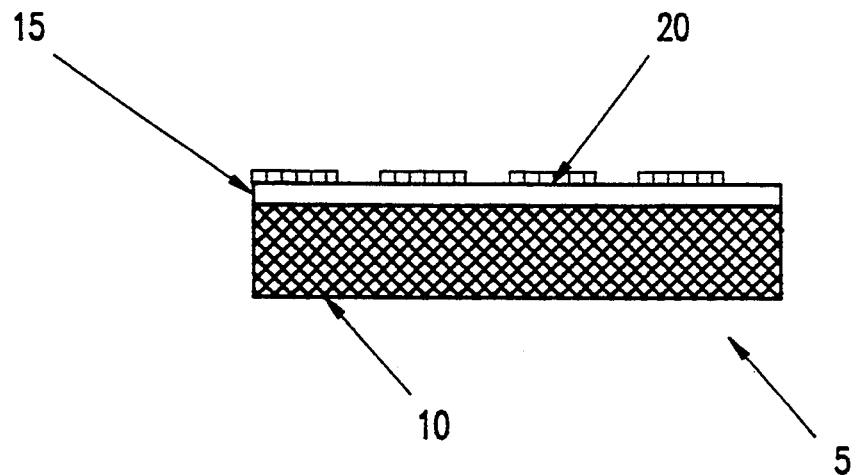
FIG. 1 illustrates a cross section through a layer of metallized stripes.

We can describe the inventions by using a scale factor U which is the reciprocal of the radius of curvature of an electron (charged particle) when moving in a plane perpendicular to a magnetic field. Then if we use a uniform magnetic field alone, the electrons move in a spiral which is tangential to the axis and the frequency of rotation is the cyclotron frequency. The distance between successive foci on the axis of the electron beam is $2\pi/U$, and the aberration coefficients are numerically equal with a value of $\pi/U$. The chromatic aberration is positive while the spherical aberration is negative.

When an electrostatic field is applied, such as in the x-direction, a drift velocity is established in the y-direction with a value given by, $$v_d = \frac{E_x}{B_z}$$

The electrons now move in a similar pattern to the previous case except that in this case the axis is at an angle $\eta$ to that of the magnetic field above, where $\eta$ is the ratio of $v_d$ to the axial velocity $v$. We are considering exactly one cyclotron orbit. The axial distance between foci is exactly the same as in the previous case and so are the aberrations. No other aberrations are added, not even energy dispersion. Furthermore, it should be noted that there are no sharp transitions upon entering or leaving the fields.

If the electrostatic field is in the same direction as the magnetic field, a mirror can be formed (to be described hereinafter); and the electrons can be refocussed at the origin after one revolution by proper adjustment of the two fields. It is this adjustment which leads to the idea of tuning. In that case, the absolute value of the aberration coefficients remain equal to $\pi/U$, but the signs are changed.

It is possible to combine the action of the deflector with that of the mirror and in that case, the aberrations are identical to those of the mirror alone if the electrons are refocussed in the plane of the origin, which can be done by proper tuning. As in the case of the deflector, no additional aberrations are introduced.

The results of the previous calculations are shown in FIG. 3A–D where we also represent the various trajectories in a symbolic manner. The elementary case of the uniform magnetic field is represented by a straight line of length $l = 2\pi/U$ which is the distance between successive foci, a distance determined by the time to complete one orbit. The aberration coefficients are equal and opposite, with a value of $C_s = -1/2$. The spherical aberration is negative, and the chromatic aberration is positive. The equality of the two coefficients, and the fact that they have opposite signs, is common to the configurations we describe. In addition, we will find that the absolute value of these coefficients can always be given in multiples of 1/2. For this reason we only need to refer to one of them, and we will choose to discuss the spherical aberration. The number attached to each of the diagrams is the multiplying factor $\Gamma$. In order to be very specific, we can say that for the uniform field, we write:

$$C_s = -C_c = \Gamma \frac{l}{2} ; \Gamma = -1$$

The deflector is represented by a line of slope $\eta$ whose axial length is also equal to $l$ and the aberrations are exactly the same as before that is, $\Gamma = -1$. The mirror is represented by a line of length $l/4$ and the aberrations are now reversed in sign, and then $\Gamma = +1$.

The mirror-deflector is represented by a hoop of height $\frac{l}{4}$, and the horizontal separation between the beginning and the end points is exactly the same as the deflector, namely $\eta l$. The aberrations are exactly those of the mirror and $\Gamma = +1$.

In order to convert these results into practical terms there are only a few quantities whose values we need to know. Deflections are characterized by the parameter $\eta$ while distances such as the position of the focus and the value of the aberration coefficients are given in terms of the parameter $U$ or rather, its inverse. In order to convert these results into practical units we present the following transformations. The numerical values are the ones that are appropriate for electrons.

$$U = \frac{B}{R} = 2.96 \times 10^5 \frac{B}{\sqrt{V}} \ (m^{-1})$$

$$l = \frac{2\pi}{U} = 2.12 \times 10^{-5} \frac{\sqrt{V}}{b} \ (m.)$$

$$\eta = \frac{E_x}{Bv} = 1.68 \times 10^{-6} \frac{E_x}{B\sqrt{V}} \left( \frac{E_x}{\pi} E_2 \right)$$

$$\eta l = 3.58 \times 10^{-11} \frac{E_x}{B^2} \ (m)$$

$$\omega = \frac{eB}{m} = \frac{1.75 \times 10^{-11}}{B} \ (rev \cdot sec^{-1})$$

$$t_0 = \frac{2\pi}{\omega} = \frac{3.58 \times 10^{-11}}{B} \ (sec.)$$

where R is the magnetic rigidity, here given in Tesla meters, $v$ is the velocity of the electrons on the axis, and $\omega$ is the cyclotron frequency in revolutions per second. The expression for $\eta$ which is given in parenthesis is applicable to the case of the mirror-deflector.

These four elementary forms have many aspects in common. In each case they represent one complete cyclotron orbit so that if we place a source of electrons at the entrance, we will have a focus at the exit. In addition there is a great deal of symmetry in the trajectories so that the angle of convergence of the electrons at the image is equal to the angle of emission at the source. Since there is no net acceleration, the magnification in each case is equal to one. The spherical and chromatic aberrations are always equal in magnitude and opposite in sign. Two of the forms have opposite aberrations to the other two.

We can use these elementary forms in practical devices and combine them into functional units. This raises the problem of injecting and extracting the electrons. In the case of the magnetic field distribution, it is not an easy matter to arrange for a sharp transition from zero to full value, and we will therefore assume the case that the magnetic field is uniform everywhere. The entrance and exit of the electron beam can then take place in a region where the field can be increased or decreased in whatever manner desired.

Illustrated Example Structures of the Invention

We now illustrate exemplary structures of the invention described generally hereinbefore.

Figure 2:
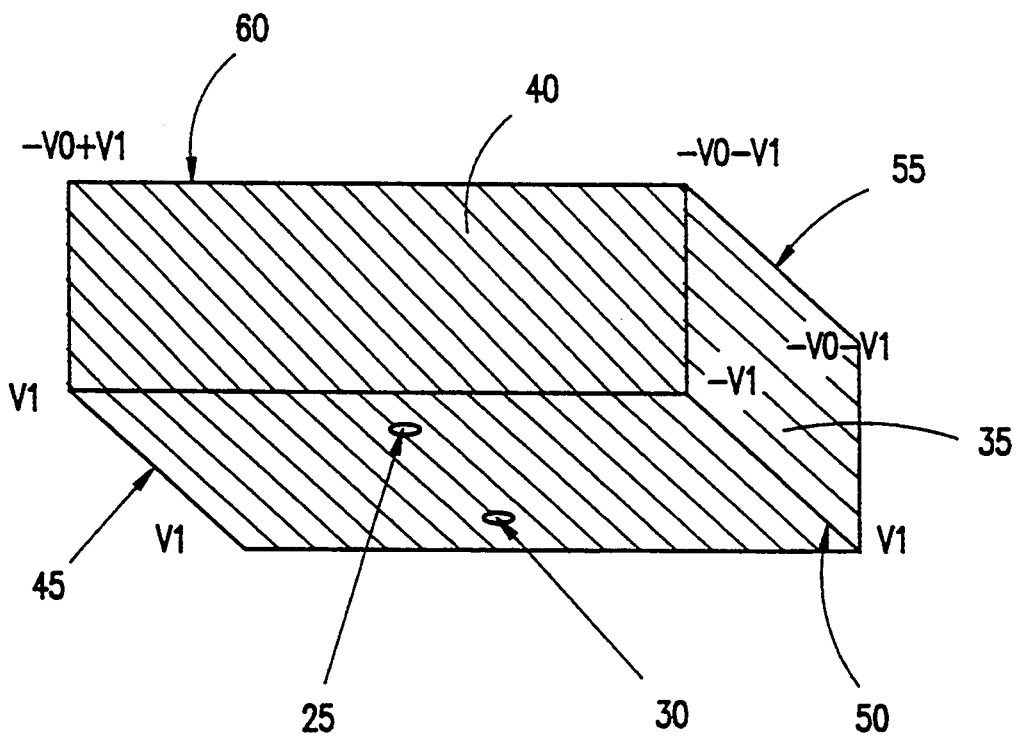
FIG. 2 shows a mirror deflection box.

In the case of electrostatic fields we can make sharp transitions by generating the electrostatic field inside a thin insulating box with orthogonal sides. As shown in FIGS. 1 and 2 one can construct a mirror/deflector (box) 5 with voltage applied to the four indicated edges. The metal stripes would be on a diagonal on two of the lenses. In FIG. 1 is illustrated one form of structure for the mirror/deflector 5. The mechanical strength of the mirror/deflector resides in the insulating walls of the glass 10 which can be made of glass or some suitable plastic, such as poly-amide. The surface is coated with a poorly conducting layer 15 which is chosen to allow a small electrical current to flow when a high voltage is applied to the ends. A resistance of 1,000 megohms would be suitable. Metal stripes 20 are printed on the surface using conventional photolithography. Their purpose is to spread the voltage distribution evenly thereby eliminating problems due to uneven application of the conducting layer. A suitable conducting layer can also be a silicon—carbon mixture deposited by evaporation or CVD.

The fields that we need can be generated by arranging the necessary potential gradients along the walls of the box 5 by any number of arrangements of thin conductors. The electrons can then enter and leave the box 5 through very small apertures. We do not expect any deleterious effects from the apertures since the electrons are always focused in the aperture plane.

FIG. 2 also illustrates the mirror/deflector 5 from the underside. All walls of the mirror and/or deflector box 5 are preferably fabricated using the technique illustrated in FIG. 1. The metal stripes 20 are also indicated. For the lower surface there are two small apertures 25, 30 for the entry and exit of the electron beam. The metal stripes 20 are parallel to one edge. The top surface would be identical but the apertures 25, 30 could be omitted.

The side walls 35 also have metal stripes 20 parallel to the top and bottom: One of the walls is invisible in this illustration, and it is identical to the visible one. The front wall 40 has metal stripes along a diagonal as indicated. The back wall is invisible but is identical to the front wall.

A voltage of VI is applied to the edge 45. A voltage of —VI is applied to the edge 50. A voltage of —VO—VI is applied to the edge 55 (which is invisible here). A voltage of —VO+VI is applied to the edge 60 (which is invisible here). By applying these four voltages the necessary electric fields are established inside the box 5.

We can now proceed to use the elementary forms of the invention as building blocks and arrange them in convenient patterns. The aberrations simply add together since the magnification is always equal to one. In the following sections we present some applications of the use of these components, taken singly or in various combinations.

The various configurations that we will consider here are shown in FIG. 3. We will reference the discussion to the Figures.

FIG. 3A. Embodiment ($\Gamma = -1$

The uniform magnetic field can act as a transfer lens with $C_s = -1/2$.

FIG. 3B. Embodiment ($\Gamma = -1$

The tuned deflector has some useful properties. There are no second order aberrations and $C_s = -1/2$. The deflection is exactly linear, and the electrons are focused in a line on the y-axis as $E_x$ is varied. Unlike most deflecting devices, the chromatic effects are no worse than those of the transfer lens and are independent of the deflection. This implies that the number of resolution elements that can be scanned is only dependent on the stability of the E and B fields, not on the energy spread of the electrons. Using standard practices, it should be possible to scan about $10^6$ elements.

The electrons are focused on a line of constant potential and can therefore be passed through a slit. This makes the deflector useful for cases where the target is moving in a direction perpendicular to the slit. Such systems are used in electron beam lithography for example, and the concept could be valuable for reading information on a moving tape.

One can also use this concept for heavy ions, for example in a mass-spectrometer or a leak detector. The deflection $\eta l$ only depends upon the square root of the mass of the particle and the ratio $E/B^2$. The primary concern would be that of keeping the value of l within reasonable limits. This is made somewhat easier by the fact that the chromatic aberrations are well controlled and the accelerating voltage can be low.

It is also possible to convert this linear deflector into a two-dimensional deflector. The final target would need to tolerate the existence of a field across the surface since no slit can be used; however, there is one configuration that can be used in a two-dimensioned manner, and that is a circular deflector. In that case a circular slit could be used, and such a system could find a use as a rotating electron beam for an X-ray machine.

FIG. 3C. Embodiment ($\Gamma = -1$

Figure 4:
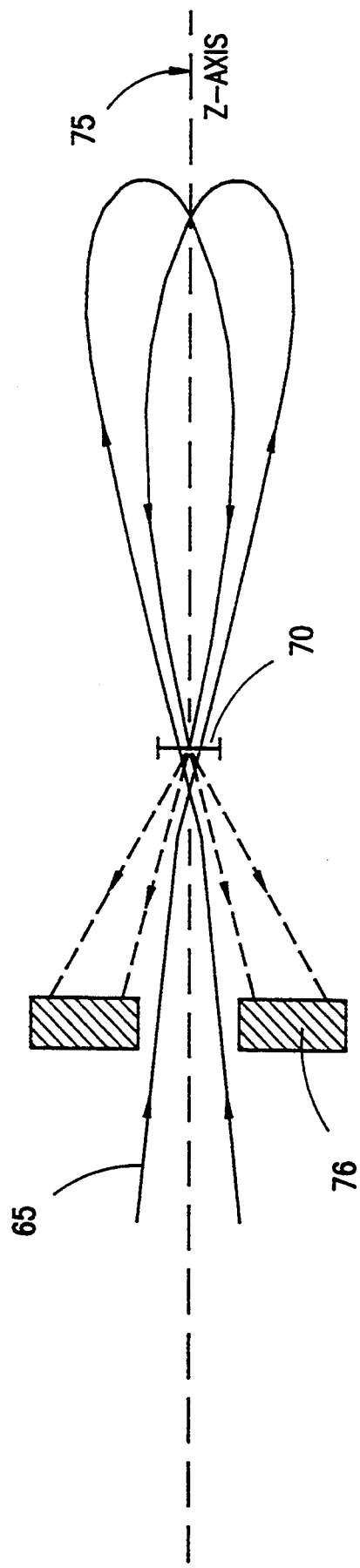
FIG. 4 illustrates a STEM system having a mirror combined with a normal lens.

In this mode, the spherical aberration is positive and the chromatic aberration is negative. This allows us to consider the possibility of combining the mirror with a normal lens to achieve an aberration-free system. This can be done most conveniently in a STEM, and this is illustrated in FIG. 4. An electron beam is focused onto a thin specimen by the pre-field of the mirror. We assume that this can be done in such a way that $C_s = -C_c$ (up to this point in the trajectory); or alternatively that only one of the aberrations is important. After passing through the specimen, the electrons are reflected by the mirror; and the aberrations are reduced to zero. After passing through the specimen for the second time, scattered electrons can be detected using an annular detector. Note that the first passage is not too important because the number of scattered electrons is small (a few percent in normal usage); and the irradiated area is much larger in the first passage than the second.

With particular reference again to FIG. 4, a beam of electrons 65 enters from the left and is focused by the magnetic field onto the specimen 70. The magnetic field is uniform and is directed along the Z-axis 75. The focus of the electron beam 65 will suffer from spherical and chromatic aberration. By suitable adjustments made to the incoming beam 65, using standard practices known to microscope designers, the co-efficients of aberration can be made numerically equal if desired.

An electrostatic field is established to the right of the specimen 70 and acts as a mirror to return the electrons 65 to the specimen 70. By suitable adjustments of the strength of this field, using equations given hereinbefore, the electrons 65 can be refocused to the specimen 70. The aberrations on the right-hand side can be made equal and opposite to those on the left so that this second focus is free from aberrations.

The microscope can be made to form an image using the annular detector 76. The use of such a detector 75 is standard practice. By scanning the electron beam 65 in a small "raster" scan, and synchronously scanning a display tube, the output of the detector 76 can be used to control the intensity of the display tube, thereby forming an image of the specimen 70.

As an indication of the mathematics, let us assume that we can choose the aberration of the lens in such a way that the optimized resolution using the pre-field alone is 3A, a reasonably conservative figure. Since we propose to reduce the aberrations to zero, we might expect to have an improvement of a factor of two before higher order aberrations come into play. This implies that we would have to increase the convergence angle by a factor of two also in order to reduce the effects of diffraction. This would make the resolution of the pre-field aline worse by a factor of $2^3$. Then we can see that the irradiated area in the first passage would be around 25A while the final resolution would be 1.5A.

FIG. 3D. Embodiment ($\Gamma = -1$

In this mode the aberrations are exactly the same as in the mirror. The system can be used in the same way as the deflector itself, providing that a suitably small target is used. This arrangement would be especially useful in the case of the mass-spectrometer since the axial length of the field region is shorter by a factor of four, giving a substantial reduction in the number of ampere turns in the magnet and a reduction in power of a factor of sixteen.

FIG. 3E. Embodiment ($\Gamma = 0$

In the following arrangements we try various combinations of the elementary forms of FIG. 3A ... 3D. The first one is the combination of the mirror-deflector with the lens. This configuration has the attractive feature of having zero aberrations (that is $C_s = C_c = 0$). Naturally, one would expect that higher order aberrations would exist, but nevertheless, the performance of any instrument using this system would be better than the performance using 3B or 3D. Alternatively, for the same resolution, the acceptance angle would be greater.

FIG. 3F. Embodiment ($\Gamma = 0$

This combination is similar to the previous one except that a deflector is used. The aberrations are again zero; but in addition, the net deflection is also zero which reduces the sensitivity to the field stability.

FIG. 3G. Embodiment ($\Gamma = +2$

This arrangement is convenient when it is desired to have an aberration corrector and still have the electron beam move in the original direction. This would be true, for example, in the SEM.

FIG. 3H. Embodiment ($\Gamma = +1$

This serves the same function as the previous case except that a deflector is used to replace the electron beam on the original trajectory. This makes the system more stable since the net deflection is zero. Note that the deflection field must be twice as strong in the deflector as in the mirror-deflector regions.

FIG. 3I. Embodiment ($\Gamma = -1$

On the face of it, this embodiment appears to be complicated, but in fact, it can be one of the best arrangements. The net deflection is zero, and there are three units of positive spherical aberration which can be used as a corrector for in-line applications. One reason for the attractiveness is that when the deflecting and mirror fields are switched off, the electron beam can proceed along the axis with the same first order properties. This would allow an SEM to be aligned and operated at low resolution without the corrector. The deflecting fields, and the mirror could then be used for the high resolution mode.

Using the above described embodiments various systems can be constructed to take advantage of the invention. A first system consists of a uniform magnetic field whose direction is also the general direction of motion of the electrons together with a uniform electrostatic field in the same direction as the magnetic field but chosen so that the electrons are reflected back to their source. By proper adjustment of the electrostatic field the electrons can be brought to a focus in the plane of origin, that is to say they can be refocused on to the source. The aberrations of the image of the source are exactly opposite to those in the two previous cases.

In another system, a uniform magnetic field is used, and the direction is also the general direction of motion of the electrons together with a uniform electrostatic field which is directed such that it has components at right angles to the magnetic field and also components which act as a mirror. The electrons are therefore reflected back towards the source and also deflected in a direction at right angles to the magnetic field. By proper adjustment of the strength of the electrostatic field the electrons will be brought to a focus in the plane of the origin, that is to say, in the plane of the source but they will be separated by some distance from that source. The aberrations of the focused spot or image are exactly equal to the mirror alone.

In a system one can use a method for confining the electrostatic field to just the region where it is needed so that the building blocks can be assembled together in any one of a wide variety of possible configurations. This consists of constructing the field by using thin insulating walls, each of which is covered with a layer of material with a very high resistance which allows some electric current to flow, but he current is limited. This layer is to be covered with metallized strips which are in a direction perpendicular to the direction of the desired electrostatic field and are spaced closely together. Their purpose is to establish the proper equipotentials for the field. This type of construction allows the blocks to be placed directly on top of each other or side by side.

In another system the building blocks for electron optical systems are used to bring the electron beam to a focus at the entrance and exit apertures of each of the building blocks so that they can be stacked together to make more complex systems of units for various purposes.

The arrangement of FIG. 3B can be used to deflect the electron (or ion) beam over large distances in a very precise manner without introducing deflection aberrations. It could find use in areas such as electron beam lithography, display devices, X-ray tomography, mass spectrometers and electron beam memory systems.

In the system of FIG. 3C this mirror could be used to improve the resolution of electron microscopes as shown in more detail in FIG. 4. Application to a STEM system can result in the design of such a microscope without aberrations.

In FIG. 3D the combination of the mirror with the deflector can find applications as a mass-spectrometer. It can be more important than the deflector alone, because one obtains the same effect of separation by mass in a smaller space. Since the space is occupied by magnetic field, the power consumption and the amount of iron is greatly reduced. The maximum movement in the direction of the magnetic field is four times less than in the deflector alone.

In FIG. 3E the system is an important improvement for the mass spectrometer applications, and there are also many other applications. The system has a wide applicability in devices due to zero aberrations. The aberrations which are accumulated in the first part of the trajectory are cancelled by those in the second part. The net effect is a focus which only depends on geometrical consideration, such as the size of the source. Naturally, diffraction may also be important if full advantage is taken of this system. The quality of the final image will depend on the stability of the two fields that are used, the magnetic and the electrostatic. We know of no system that would eliminate the spherical and chromatic aberrations of, for example, a mass spectrometer and also provide focussing in two dimensions.

In FIGS. 3F and H these configurations can find use in a variety of applications. In FIG. 3I this system also has many applications. Here we propose to use four mirrors in the arrangement shown. When the mirror fields are turned off the electrons pass through the system in the normal manner and the beam is focused on the axis with the usual aberrations. When the mirror fields are turned on, the electrons are deflected first away from the axis and then back again and in the process the aberrations are changed in sign. This system can therefore act as a corrector of aberrations since it can be placed in line with other lenses in various configurations and can be used to correct the aberrations of those lenses.

What is claimed is:

1. A system for reducing aberration of a charged particle beam, comprising:
    means for generating a charged particle beam; and
    building block means for generating at least one of (1) a magnetic field and (2) a combination of a magnetic field and an electrostatic field for controlling said charged particle beam from a focal point at an entrance to said building block means to a focal point at an exit from said building block means and each building block of said building block means having coefficients of spherical and chromatic aberration equal and opposite and having a numerical value which is an integral multiple of one-half a characteristic length l being a distance at which said charged particle beam is focused along the axis of a uniform magnetic field generated by said building block means.

2. The system as defined in claim 1 wherein two of said building blocks have negative values of said coefficient of spherical aberration while the other two said building blocks have positive values of spherical aberration.

3. A system for operating on a charged particle beam to reduce aberration in the beam, comprising:
    means for generating a uniform magnetic field whose axis is along the general direction of motion of said charged particle beam; and
    means for generating a uniform electrostatic field at right angles to the uniform magnetic field, the charged particles being deflected by the magnetic field and electrostatic field in a direction at right angles to both of the fields and brought to a focus at a distance l along the axis of the uniform magnetic field as it would have been without the electrostatic field with coefficients of aberration summing to zero.

4. The system as defined in claim 3 wherein coefficients of spherical and chromatic aberration are equal and opposite in sign.

5. A system for operating on a charged particle beam to reduce aberration in the beam, comprising:
    means for generating a charged particle beam;
    means for generating a uniform magnetic field whose axis is along the general direction of motion of said charged particle beam; and
    means for generating a uniform electrostatic field parallel to said magnetic field and causing said charged particle beam to be reflected back to and refocused in a plane of origin from said means for generating the charged particle beam with the aberrations from the uniform magnetic field and the uniform electrostatic field having equal magnitude and opposite sign.

6. The system as defined in claim 5 wherein said charged particle beam has an angle of convergence at an image formed by said beam being equal to an angle of emission from said means for generating the charged particle beam.

7. The system as defined in claim 5 further including means for generating another uniform electrostatic field at right angles to the uniform magnetic field causing said charged particle beam to be deflected by the magnetic field and said another electrostatic field and said uniform electrostatic field of claim 5 combining to cause refocusing of said charged particle beam in a plane of origin from said means for generating the charged particle beam, thereby enabling separation of an incoming charged particle beam from an outgoing charged particle beam.

8. The system as defined in claim 5 wherein said system comprises an imaging system for said charged particle beam.

* * * * *

UNITED STATES PATENT AND TRADEMARK OFFICE
CERTIFICATE OF CORRECTION

PATENT NO. : 5,336,891
DATED : August 9, 1994
INVENTOR(S) : Albert V. Crewe

It is certified that error appears in the above-identified patent and that said Letters Patent is hereby corrected as shown below:

Column 4, Line 32, Cancel "mere" and insert -- more --;

Column 6, Line 25, Cancel
"$\eta \frac{E_x}{B\mathcal{V}} \quad 1.68 \times 10^{-6} \frac{E_x}{B\sqrt{V}} \left( \frac{E_x}{\pi} E_2 \right)$"

and insert --
$\eta = \frac{E_x}{B\mathcal{V}} = 1.68 \times 10^{-6} \frac{E_x}{B\sqrt{V}} \left( = \frac{E_x}{\pi} E_2 \right)$ --;

Column 6, Line 36, Cancel "$\mathcal{V}$" and insert -- V --.

Signed and Sealed this

First Day of November, 1994

Attest:

BRUCE LEHMAN

Attesting Officer     Commissioner of Patents and Trademarks